United States Patent
Lee et al.

(10) Patent No.: US 12,230,621 B2
(45) Date of Patent: *Feb. 18, 2025

(54) OPTICAL NAVIGATION MODULE PERFORMING LATERAL DETECTION

(71) Applicant: PixArt Imaging Inc., Hsin-Chu County (TW)

(72) Inventors: Sai-Mun Lee, Penang (MY); Lye-Pin Chu, Penang (MY)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/424,903

(22) Filed: Jan. 29, 2024

(65) Prior Publication Data

US 2024/0170466 A1 May 23, 2024

Related U.S. Application Data

(63) Continuation of application No. 17/344,144, filed on Jun. 10, 2021, now Pat. No. 11,942,462, which is a continuation of application No. 16/199,341, filed on Nov. 26, 2018, now Pat. No. 11,063,028, which is a continuation of application No. 14/712,012, filed on May 14, 2015, now Pat. No. 10,192,856.

(60) Provisional application No. 62/097,725, filed on Dec. 30, 2014.

(51) Int. Cl.
*H01L 25/16* (2023.01)
*G06F 3/0354* (2013.01)
*G06F 3/042* (2006.01)
*H01L 27/146* (2006.01)

(52) U.S. Cl.
CPC ............ *H01L 25/167* (2013.01); *G06F 3/042* (2013.01); *G06F 3/0354* (2013.01); *H01L 27/14618* (2013.01)

(58) Field of Classification Search
CPC . H01L 25/167; H01L 27/14618; G06F 3/042; G06F 3/0354
See application file for complete search history.

(56) References Cited

U.S. PATENT DOCUMENTS

| | | | | |
|---|---|---|---|---|
| 6,259,108 B1* | 7/2001 | Antonelli | ........... | G06V 40/1335 382/126 |
| 6,764,008 B2* | 7/2004 | Tsikos | ................ | G06K 7/10683 235/472.01 |
| 8,618,468 B2* | 12/2013 | Drzymala | .......... | G06K 7/10732 250/221 |
| 8,988,392 B2* | 3/2015 | Liu | ........................ | G06F 3/0428 345/175 |
| 10,192,856 B2* | 1/2019 | Lee | .......................... | G06F 3/042 |
| 11,063,028 B2* | 7/2021 | Lee | ........................ | H01L 25/167 |
| 11,942,462 B2* | 3/2024 | Lee | ........................ | H01L 25/167 |
| 2007/0063130 A1* | 3/2007 | Ahn | ..................... | G06F 3/03547 250/221 |

(Continued)

*Primary Examiner* — Jennifer D Bennett
(74) *Attorney, Agent, or Firm* — WPAT, PC

(57) ABSTRACT

There is provided an optical navigation module including an optical package and a light reflective element. The optical package includes an image sensor which has a sensor surface. The light reflective element is configured to reflect light propagating parallel to the sensor surface to light propagating perpendicular to the sensor surface to impinge on the sensor surface thereby performing the lateral detection.

20 Claims, 5 Drawing Sheets

(56) References Cited

U.S. PATENT DOCUMENTS

2013/0272740 A1* 10/2013 Nakagawa ............. G01N 21/55
                                                                     250/225

* cited by examiner

OPTICAL NAVIGATION MODULE PERFORMING LATERAL DETECTION

CROSS REFERENCE TO RELATED APPLICATION

This application is a continuation application of U.S. application Ser. No. 17/344,144, filed on Jun. 10, 2021, which is a continuation application of U.S. application Ser. No. 16/199,341, filed on Nov. 26, 2018, which is a continuation application of U.S. application Ser. No. 14/712,012, filed on May 14, 2015, which claims the priority benefit of U.S. Provisional Application Ser. No. 62/097,725, filed on Dec. 30, 2014, the full disclosures of which are incorporated herein by reference.

To the extent any amendments, characterizations, or other assertions previously made (in this or in any related patent applications or patents, including any parent, sibling, or child) with respect to any art, prior or otherwise, could be construed as a disclaimer of any subject matter supported by the present disclosure of this application, Applicant hereby rescinds and retracts such disclaimer. Applicant also respectfully submits that any prior art previously considered in any related patent applications or patents, including any parent, sibling, or child, may need to be re-visited.

BACKGROUND

1. Field of the Disclosure

This disclosure generally relates to an optical navigation system and, more particularly, to an optical navigation module capable of performing the lateral detection and adjusting the tracking distance.

2. Description of the Related Art

A basic opto-mechanical construction of an optical navigation system consists of a sensor mated with a lens, wherein a navigation surface is substantially parallel to a mounting plane of the sensor. The optical navigation system further consists of an illuminator to illuminate an area of interest on the navigation surface, but there is generally less constraints on a mounting direction of the illuminator with respect to the navigation surface.

In some cases, it is desired to track a surface or an object that is at an angle (not parallel) to a main board of the optical navigation system. In such cases, since current optical navigation solutions are limited to track surfaces parallel to a sensor plane, the sensor has to be mounted at a desired angle relative to the main board. FIG. 1 shows an existing solution in which a sensor 95 is mounted on a separate printed circuit board (PCB) 93, which is connected to a main board 91 at an angle, via a right-angle connector 97. However, this solution requires increased handling as well as additional costs (e.g. for the separate PCB 93, right-angle connector 97, assembly, etc.). In addition, this solution occupies significant amount of space.

Another characteristic of current optical navigation solutions is that a nominal tracking distance from the sensor to the navigation surface is fixed. The optical system design may accord some deviations from this nominal tracking distance, but this is usually limited to about +/−0.3 mm and typically would carry some penalty in degraded performance.

SUMMARY

Accordingly, the present disclosure further provides an optical navigation module capable of performing the lateral detection and adjusting the tracking distance.

The present disclosure provides an optical navigation module including an optical package and a reflective structure. The optical package has a package surface and includes an image sensor arranged on the package surface and a light emitter arranged on the package surface and configured to emit illumination light upward. The reflective structure is opposite to the optical package and includes a detection plane, a detection opening at the detection plane, a first reflective portion, a second reflective portion and a wall. The detection plane is perpendicular to the package surface of the optical package. The first reflective portion is opposite to the image sensor and configured to reflect incident light coming from the one detection opening downward to impinge on the image sensor. The second reflective portion has a first end configured to reflect the illumination light from the light emitter to go out the optical navigation module via the same one detection opening, and further has a second end extending toward the same one detection opening from the first end of the second reflective portion. The wall extends toward the same one detection opening between the first reflective portion and the second reflective portion, wherein a front end of the wall is not reaching the detection plane.

The present disclosure further provides an optical navigation module including a substrate, an optical package and a reflective structure. The optical package includes an image sensor arranged upon the substrate and a light emitter arranged upon the substrate and configured to emit illumination light. The reflective structure is opposite to the optical package and includes a detection plane perpendicular to the substrate, a detection opening at the detection plane, a first reflective portion, a second reflective portion and a wall. The first reflective portion is aligned with the image sensor and configured to reflect incident light coming from the one detection opening toward the image sensor. The second reflective portion has a first end and a second end, wherein the first end of the second reflective portion is aligned with the light emitter to reflect the illumination light from the light emitter to go out the same one detection opening, and the second end of the second reflective portion extends toward the same one detection opening from the first end of the second reflective portion. The wall extends toward the same one detection opening between the first reflective portion and the second reflective portion, wherein a front end of the wall is not reaching the detection plane.

The present disclosure further provides an optical navigation module including an optical package and a reflective structure. The optical package has a package surface and includes an image sensor arranged on the package surface and a light emitter arranged on the package surface and configured to emit illumination light upward. The reflective structure is opposite to the optical package and includes a detection plane perpendicular to the package surface, a first detection opening and a second detection opening at the detection plane, a first reflective portion, a second reflective portion and a wall. The first reflective portion is opposite to the image sensor and configured to reflect incident light coming from the first detection opening downward to impinge on the image sensor. The second reflective portion has a first end configured to reflect the illumination light emitted by the light emitter to go out the optical navigation module via the second detection opening, and further having a second end extending toward the second detection opening from the first end of the second reflective portion. The wall extends toward the detection plane between the first reflective portion and the second reflective portion, wherein the first reflective portion is connected to one side of the wall and the second reflective portion is connected to a side opposite to the one side of the wall, and a front end of the wall is a tapered end and not connected to the detection plane.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
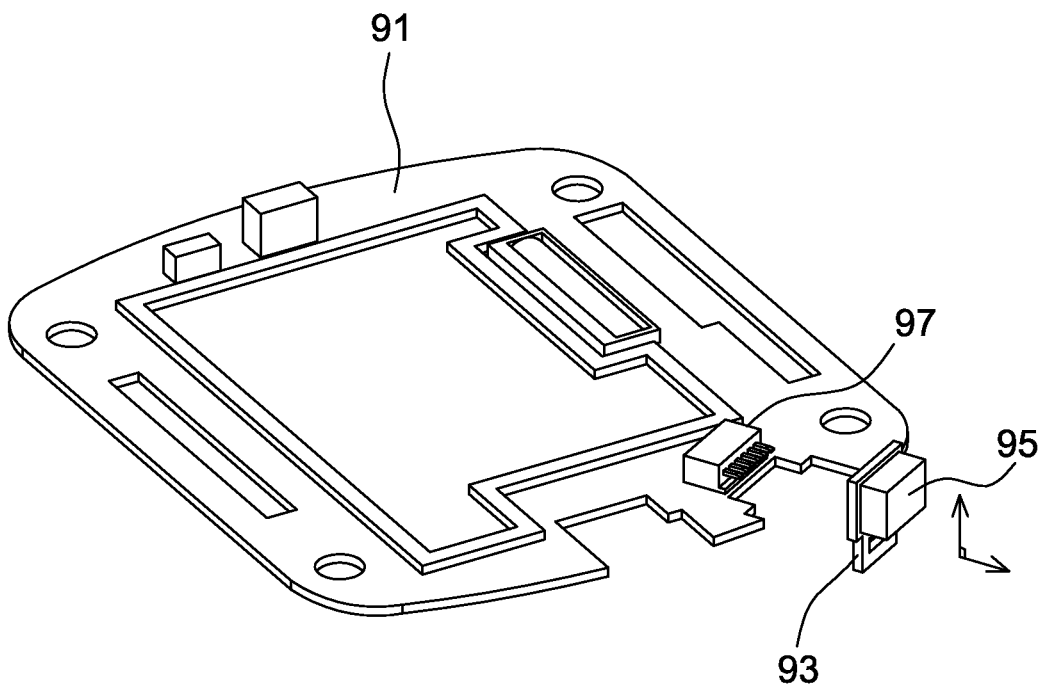
FIG. 1 is a schematic diagram of a main board and a separate PCB of a conventional optical navigation system.
Figure 2:
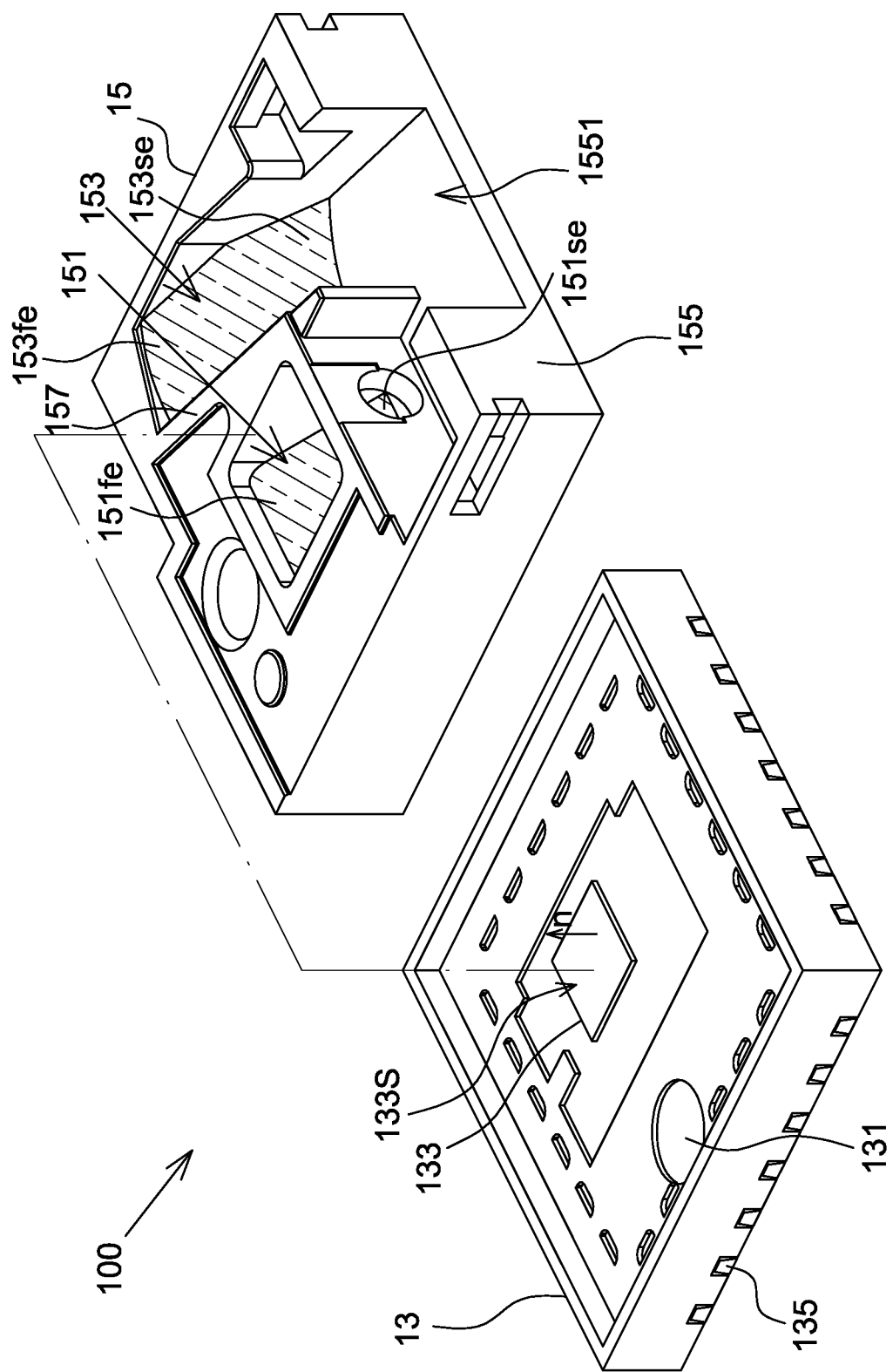
FIG. 2 is an exploded schematic diagram of an optical navigation module according to one embodiment of the present disclosure.
Figure 3:
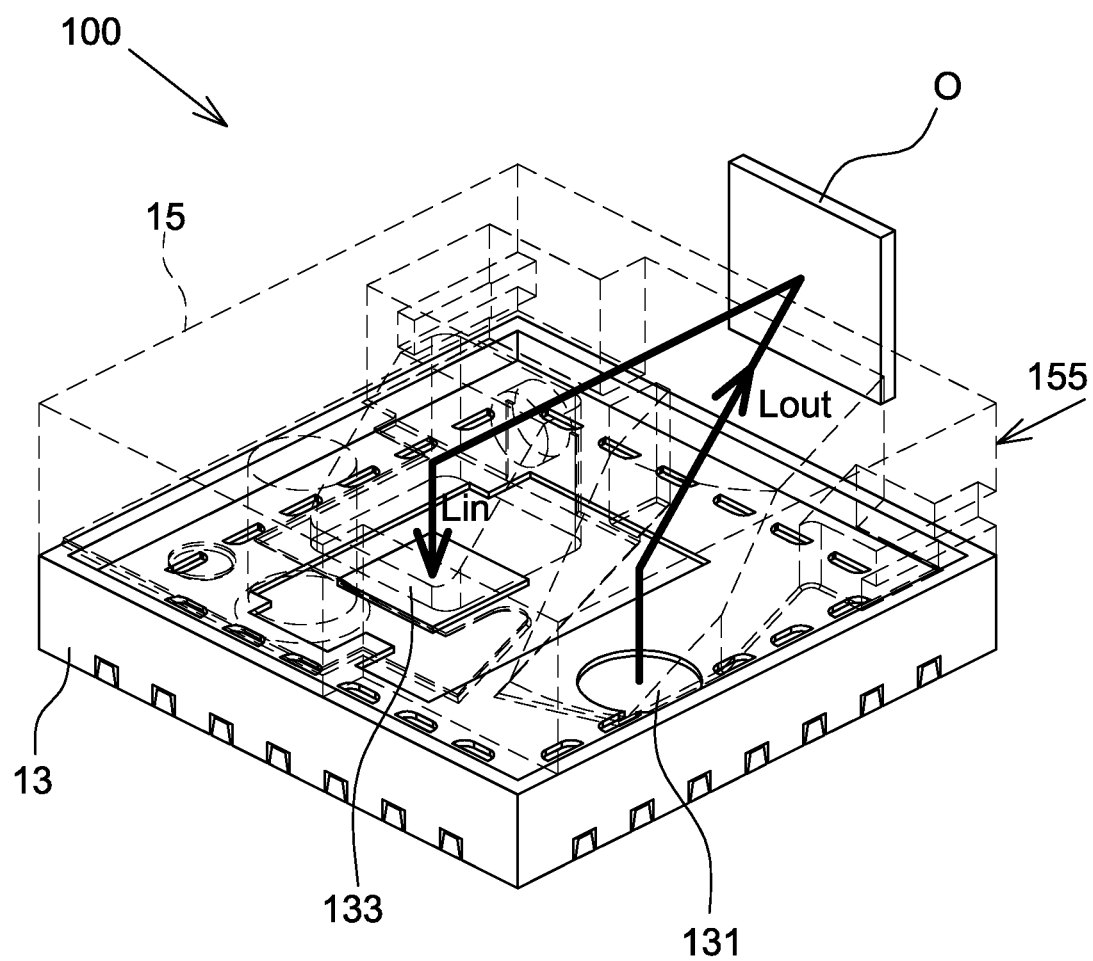
FIG. 3 is a combined perspective view of the optical navigation module shown in FIG. 2.

Referring to FIGS. 2 and 3, FIG. 2 is an exploded schematic diagram of an optical navigation module 100 according to one embodiment of the present disclosure, and FIG. 3 is a combined perspective view of the optical navigation module 100 shown in FIG. 2. The optical navigation module 100 includes an optical package 13 and a reflective structure 15, wherein the reflective structure 15 covers on the optical package 13 and is configured to reflect incident light Lin and illumination light Lout (described hereinafter). The reflective structure 15 is made, for example, by molding, and a cross section of the reflective structure 15 is larger than, equal to or smaller than that of the optical package 13 without particular limitations as long as the light propagating therein is reflected.

The optical package 13 includes a light emitting chip 131 and an image sensor 133. The image sensor 133 includes, for example, a charge coupled device (CCD) image sensor or a complementary metal oxide semiconductor (CMOS) image sensor or other sensors for converting optical energy to electric signals. The image sensor 133 has a sensor surface 133S, and the incident light Lin impinges on the sensor surface 133S. The light emitting chip 131 includes, for example, a light emitting diode or a laser diode, and is configured to emit illumination light Lout toward a normal line direction n of the sensor surface 133S, wherein the illumination light Lout is configured to provide light required by the image sensor 133 in capturing images. The method of encapsulating a light emitting chip and an image sensor in an optical package is known to the art and thus details thereof are not described herein.

The reflective structure 15 includes a first reflective portion 151, a second reflective portion 153, a detection plane 155 and a detection opening 1551, wherein when the reflective structure 15 is covered on the optical package 13, the detection plane 155 is substantially perpendicular to the sensor surface 133S, but not limited thereto. In other embodiments, the detection plane 155 is a tilt surface. The detection opening 1551 is located at the detection plane 155 and opposite to an object O, e.g. a tracking surface. The detection opening 1551 is for the illumination light Lout emitted from the light emitting chip 131 to leave the reflective structure 15 and for the reflected light from the object O (i.e. the incident light Lin) to enter the reflective structure 15. A shape and size of the detection opening 1551 do not have particular limitations as long as the light can leave and enter therethrough. The object O is fixed or movable with respect to the detection opening 1551 according to different applications. The first reflective portion 151 and the second reflective portion 153 are formed inside the reflective structure 15.

The first reflective portion 151 has a first end 151$fe$ and a second end 151$se$, wherein the first end 151$fe$ of the first reflective portion 151 is substantially aligned with the image sensor 133 (preferably aligned with the sensor surface 133S thereof) and the second end 151$se$ of the first reflective portion 151 connects to the detection opening 1551. The first reflective portion 151 is configured to reflect incident light Lin to impinge on the sensor surface 133S, wherein the incident light Lin parallel to the sensor surface 133S is reflected to perpendicular to the sensor surface 133S. As mentioned above, the incident light Lin is generated by the object O from reflecting the illumination light Lout. More specifically, the reflective structure 15 further includes, in the first reflective portion 151 (e.g. at the region filled with inclined lines), at least one of a reflective surface, a prism having one surface thereof being a reflective surface and a diffractive optical element (DOE) having one surface thereof being a reflective surface configured to reflect the light propagating therein, e.g. the incident light Lin. The reflective surface is formed by coating a reflective layer on an inner surface of the first reflective portion 151, wherein the reflective layer is a metal layer, a non-metal layer or a combination thereof without particular limitations as long as a target spectrum (e.g. a sensing spectrum of the image sensor 133) is effectively reflected. The prism is, for example, a total internal reflective (TIR) prism which is disposed at a suitable position in the first reflective portion 151.

The second reflective portion 153 has a first end 153$fe$ and a second end 153$se$, wherein the first end 153$fe$ of the second reflective portion 153 is substantially aligned with the light emitting chip 131 and the second end 153$se$ of the second reflective portion 153 connects to the detection opening 1551. The second reflective portion 153 is configured to reflect the illumination light Lout in the normal line direction n emitted by the light emitting chip 131 to parallel to the sensor surface 133S and eject from the reflective structure 15, i.e. through the detection opening 1551. More specifically, the reflective structure 15 further includes, in the second reflective portion 153 (e.g. at the region filled with inclined lines), at least one of a reflective surface, a prism having one surface thereof being a reflective surface and a diffractive optical element having one surface thereof being a reflective surface configured to reflect the light propagating therein, e.g. the illumination light Lout in the normal line direction n emitted by the light emitting chip 131. The formation of the reflective surface, prism and diffractive optical element of the second reflective portion 153 is similar to that of the first reflective portion 151. The first reflective portion 151 and the second reflective portion 153 are separated by a wall 157 arranged therebetween.

In the above embodiments, the reflective surface, prism and diffractive optical element is formed, e.g. by coating a reflective layer, or disposing a reflective mirror, a prism having one surface thereof being a reflective surface or a diffractive optical element having one surface thereof being a reflective surface manufactured separately, after the reflective structure 15 is formed by a molding process. It should be mentioned that although in the present disclosure the reflective structure 15 is substantially shown to be a rectangular cylinder, it is only intended to illustrate but not to limit the present disclosure. In some embodiments, the detection plane 155 of the reflective structure 15 includes two detection openings which respectively connect to the second end of the first reflective portion 151 and the second end of the second reflective portion 153 according to different applications.

It should be mentioned that although FIGS. 2 and 3 show that the reflective structure 15 is a single structure and includes both the first reflective portion 151 and the second reflective portion 153, they are only intended to illustrate but not to limit the present disclosure. In other embodiments, the reflective structure 15 is formed by two molding structures which respectively include the first reflective portion 151 and the second reflective portion 153.

Figure 4:
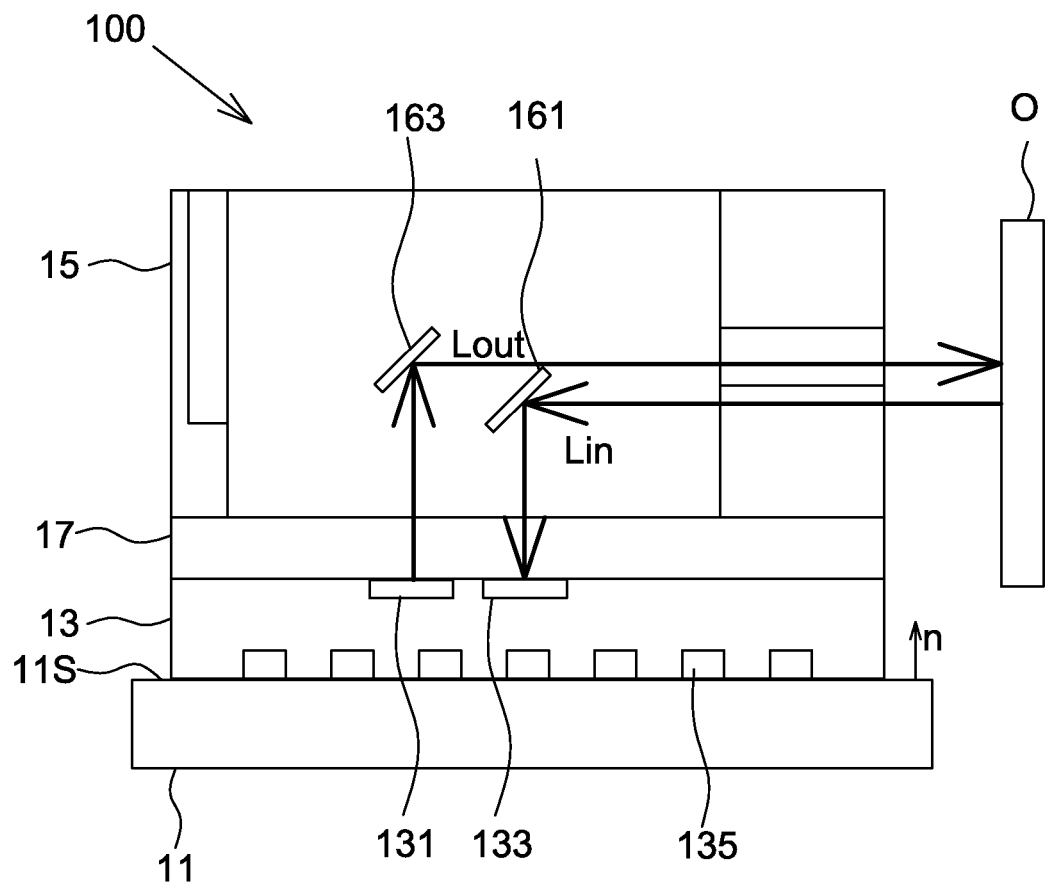
FIG. 4 is a side view of an optical navigation module according to one embodiment of the present disclosure.

Referring to FIG. 4, it is a side view of an optical navigation module 100 according to one embodiment of the present disclosure. The optical navigation module 100 further includes a substrate 11, for example, but not limited to, a printed circuit board (PCB) or a flexible circuit board (FCB), for disposing the optical package 13. For example, the substrate 11 has an upper surface 11S on which a plurality of traces and electronic components are formed. The optical package 13 is disposed on the upper surface 11A and electrically connected to the substrate 11, e.g. via a plurality of conductive pins 135. When the optical package 13 is disposed on the substrate 11, the sensor surface 133S of the image sensor 133 is substantially parallel to the upper surface 11S of the substrate 11, wherein the method of electrically connecting an optical package to a substrate is known to the art and thus details thereof are not described herein. Accordingly, the light emitting chip 131 emits illumination light Lout toward a normal line direction n of the upper surface 11S of the substrate 11. By employing the reflective structure 15, the illumination light Lout (e.g. reflected illumination light) emitted from the light emitting chip 131 ejects out a range of the optical package 13 from a side (e.g. the right side shown in FIG. 4) of the optical package 13, and the incident light Lin from outside (e.g. the reflected light from the object O) is incident into the range of the optical package 13 from the same side of the optical package 13.

Figure 5:
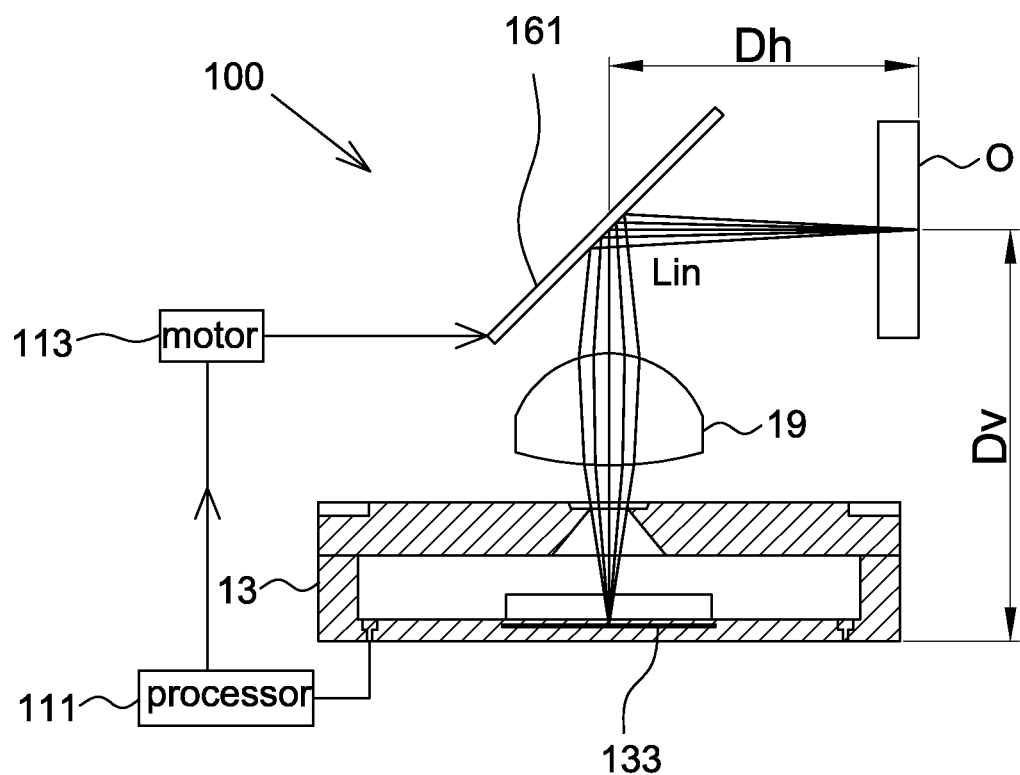
FIG. 5 is another schematic diagram of an optical navigation module according to one embodiment of the present disclosure.

Referring to FIG. 5, it is another schematic diagram of an optical navigation module 100 according to one embodiment of the present disclosure. The optical navigation module 100 further includes a condensing lens 19 configured to focus the reflected incident light so as to improve the sensing efficiency of the image sensor 133, wherein the condensing lens 19 is a biconvex lens or a plano-convex lens without particular limitations as long as it has the light focusing function. In some embodiments, the optical navigation module 100 further includes an intermediate layer 17 sandwiched between the optical package 13 and the reflective structure 15 (referring to FIG. 4), and the condensing lens 19 is formed in the intermediate layer 17, wherein the intermediate layer 17 is further configured as a protection layer of the image sensor 133, e.g. a glass layer or a transparent plastic layer, but not limited thereto. In other embodiments, the condensing lens 19 is integrated with the reflective structure 15, e.g. at the first end of the first reflective portion 15, so as to opposite to the image sensor 133. In other embodiments, the condensing lens 19 is directly integrated with the optical package 13 and aligned with the image sensor 133.

It should be mentioned that although FIGS. 2-4 show that the optical navigation module 100 includes a reflective structure 15 covering on the optical package 13, they are only intended to illustrate but not to limit the present disclosure. In some embodiments, the optical navigation module 100 does not include the reflective structure 15 but further includes two light reflective elements disposed on the optical package 13 or the substrate 11 (e.g. via supporting members). For example, referring to FIG. 4 again, when the reflective structure 15 is not included, the optical navigation module 100 includes a first light reflective element 161 and a second light reflective element 163, wherein the first light reflective element 161 and the second light reflective element 163 are reflective mirrors, prisms having one surface thereof being a reflective surface or diffractive optical elements having one surface thereof being a reflective surface. For example, FIG. 5 shows that the first light reflective element 161 is a reflective mirror, and the second light reflective element 163 is similar to the first light reflective element 161 without showing in FIG. 5. The first light reflective element 161 is configured to reflect incident light parallel to the upper surface 11S of the substrate 11 to perpendicular to the upper surface 11S of the substrate 11 to impinge on the sensor surface 133S, wherein a function of the first light reflective element 161 is similar to that of the first reflective portion 151. The second light reflective element 163 is configured to reflect illumination light in the normal line direction n emitted by the light emitting chip 131 to parallel to the upper surface 11S of the substrate 11, wherein a function of the second light reflective element 163 is similar to that of the second reflective portion 153. It should be mentioned that the spatial relationship between the incident light Lin and the illumination light Lout shown in FIG. 4 is only intended to illustrate but not to limit the present disclosure.

Referring to FIG. 5 again, it schematically shows a transverse distance Dh between the object O and the first light reflective element 161 (or the first reflective portion 151), and a vertical distance Dv between the image sensor 133 and the first light reflective element 161 (or the first reflective portion 151), wherein the vertical distance Dv is adjustable. More specifically, a vertical distance between the reflective structure 15 and the optical package 13 is adjustable, or a vertical distance between the first light reflective element 161 and the optical package 13 is adjustable. As mentioned above, a condensing lens 19 is disposed between the first light reflective element 161 (or the first reflective portion 151) and the image sensor 133 for improving the sensing efficiency. In some embodiments, the optical navigation module 100 further includes a processor 111, e.g. a microprocessor, a digital signal processor, a micro controller or the like, disposed on the substrate 11 and electrically connected to the substrate 11, wherein the processor 111 is configured to adjust the vertical distance Dv via at least one motor (e.g. the miniature electric motor or piezoelectric motor, but not limited to) 113, e.g. controlled by a user or automatically controlled according to the image quality of images captured by the image sensor 133. In this embodiment, rising or reducing a height of the first light reflective element 161 (or the reflective structure 15) changes the vertical distance Dv from the optical package 13 to further change an optimum transverse distance Dh (i.e. the tracking distance) thereby realizing the object of adjusting the tracking distance. For example, table 1 shows the relationship between the transverse distance Dh and the vertical distance Dv, but the present disclosure is not limited thereto.

TABLE 1

| transverse distance Dh (mm) | vertical distance Dv(mm) |
| --- | --- |
| 4.40 | 4.34 |
| 4.10 | 4.58 |
| 3.70 | 4.83 |
| 3.35 | 5.07 |
| 3.00 | 5.32 |
| 2.65 | 5.57 |
| 2.35 | 5.82 |

In addition, it should be mentioned that in the optical navigation module 100 according to the present disclosure, light parallel to the sensor surface 133S (or the upper surface 11S) is referred to that a main propagation direction of the light is parallel to the sensor surface 133S (or the upper surface 11S) but has a deviation between, for example, about +/−10 degrees from the sensor surface 133S (or the upper surface 11S) according to different applications; and light perpendicular to the sensor surface 133S (or the upper surface 11S) is referred to that a main propagation direction of the light is perpendicular to the sensor surface 133S (or the upper surface 11S) but has a deviation between, for example, about +/−10 degrees from the normal line direction n of the sensor surface 133S (or the upper surface 11S) according to different applications.

It should be mentioned that although in the present disclosure the optical package 13 is shown to include both the image sensor 133 and the light emitting chip 131, it is only intended to illustrate but not to limit the present disclosure. In some embodiments, when an external light source existing outside of the optical navigation module 100 or environmental light is strong enough, the optical package 100 includes only the image sensor 133 without including the light emitting chip 131 according to different applications.

As mentioned above, the conventional optical navigation system is not designed to detect a tracking surface or an object not parallel to a main board thereof, and thus a separate circuit board is required to be connected to the main board such that it has high cost and needs complicated handling. Therefore, the present disclosure further provides an optical navigation module (FIGS. 2-5) that employs a reflective structure to change propagating directions of illumination light and incident light such that it is able to detect a tracking surface or an object at an arbitrary angle with respect to the main board to lower cost and save space.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An optical navigation module, comprising:
   an optical package having a package surface, and comprising:
   an image sensor arranged on the package surface; and
   a light emitter arranged on the package surface and configured to emit illumination light upward; and
   a reflective structure opposite to the optical package and comprising:
   a detection plane perpendicular to the package surface of the optical package;
   one detection opening at the detection plane;
   a first reflective portion opposite to the image sensor and configured to reflect incident light coming from the one detection opening downward to impinge on the image sensor;
   a second reflective portion having a first end configured to reflect the illumination light from the light emitter to go out the optical navigation module via the same one detection opening, and further having a second end extending toward the same one detection opening from the first end of the second reflective portion; and
   a wall extending toward the same one detection opening between the first reflective portion and the second reflective portion, wherein a front end of the wall is not reaching the detection plane.

2. The optical navigation module as claimed in claim 1, wherein the reflective structure further comprises, in the first reflective portion, at least one of a reflective surface, a prism and a diffractive optical element configured to reflect the incident light.

3. The optical navigation module as claimed in claim 1, wherein the reflective structure further comprises, in the second reflective portion, at least one of a reflective surface, a prism and a diffractive optical element configured to reflect the illumination light emitted by the light emitter.

4. The optical navigation module as claimed in claim 1, further comprising a substrate having an upper surface and electrically connected to the optical package.

5. The optical navigation module as claimed in claim 4, wherein the optical package is disposed on the upper surface, and the package surface is parallel to the upper surface.

6. The optical navigation module as claimed in claim 1, further comprising a condensing lens configured to focus the reflected incident light.

7. The optical navigation module as claimed in claim 6, wherein the condensing lens is integrated with the reflective structure.

8. The optical navigation module as claimed in claim 1, further comprising at least one motor configured to adjust a vertical distance between the reflective structure and the optical package.

9. The optical navigation module as claimed in claim 1, wherein the wall extending toward the same one detection opening is not perpendicular to the detection plane.

10. The optical navigation module as claimed in claim 1, wherein the front end of the wall is a tapered end.

11. An optical navigation module, comprising:
    a substrate;
    an optical package, comprising:
    an image sensor arranged upon the substrate; and
    a light emitter arranged upon the substrate and configured to emit illumination light; and
    a reflective structure opposite to the optical package and comprising:
    a detection plane perpendicular to the substrate;
    one detection opening at the detection plane;
    a first reflective portion aligned with the image sensor and configured to reflect incident light coming from the one detection opening toward the image sensor;

a second reflective portion having a first end and a second end, wherein the first end of the second reflective portion is aligned with the light emitter to reflect the illumination light from the light emitter to go out the same one detection opening, and the second end of the second reflective portion extends toward the same one detection opening from the first end of the second reflective portion; and a wall extending toward the same one detection opening between the first reflective portion and the second reflective portion, wherein a front end of the wall is not reaching the detection plane.

12. The optical navigation module as claimed in claim 11, wherein the first reflective portion and the second reflective portion respectively comprise at least one of a reflective surface, a prism and a diffractive optical element configured to reflect light incident thereon.

13. The optical navigation module as claimed in claim 11, wherein a vertical distance between the reflective structure and the optical package is adjustable.

14. The optical navigation module as claimed in claim 13, further comprising at least one motor configured to adjust the vertical distance.

15. The optical navigation module as claimed in claim 11, wherein the reflective structure further comprises a condensing lens in the first reflective portion.

16. The optical navigation module as claimed in claim 11, wherein the front end of the wall is a tapered end.

17. An optical navigation module, comprising:

an optical package having a package surface, and comprising:

an image sensor arranged on the package surface; and a light emitter arranged on the package surface and configured to emit illumination light upward; and a reflective structure opposite to the optical package and comprising:

a detection plane perpendicular to the package surface;

a first detection opening and a second detection opening at the detection plane;

a first reflective portion opposite to the image sensor and configured to reflect incident light coming from the first detection opening downward to impinge on the image sensor;

a second reflective portion having a first end configured to reflect the illumination light emitted by the light emitter to go out the optical navigation module via the second detection opening, and further having a second end extending toward the second detection opening from the first end of the second reflective portion; and a wall extending toward the detection plane between the first reflective portion and the second reflective portion, wherein the first reflective portion is connected to one side of the wall and the second reflective portion is connected to a side opposite to the one side of the wall, and a front end of the wall is a tapered end and not connected to the detection plane.

18. The optical navigation module as claimed in claim 17, further comprising a condensing lens configured to focus the reflected incident light.

19. The optical navigation module as claimed in claim 17, further comprising at least one motor configured to adjust a vertical distance between the reflective structure and the optical package.

20. The optical navigation module as claimed in claim 17, wherein the first reflective portion and the second reflective portion respectively comprise at least one of a reflective surface, a prism and a diffractive optical element configured to reflect light incident thereon.

* * * * *